United States Patent [19]

Maddox, Jr.

[11] 4,218,267
[45] Aug. 19, 1980

[54] MICROELECTRONIC FABRICATION METHOD MINIMIZING THRESHOLD VOLTAGE VARIATION

[75] Inventor: Roy L. Maddox, Jr., Westminster, Calif.

[73] Assignee: Rockwell International Corporation, El Segundo, Calif.

[21] Appl. No.: 32,610

[22] Filed: Apr. 23, 1979

[51] Int. Cl.² .................... H01L 21/265; H01L 29/78
[52] U.S. Cl. .................................. 148/1.5; 148/187; 357/23; 357/91
[58] Field of Search .................. 148/1.5, 187; 357/91, 357/23

[56] References Cited

U.S. PATENT DOCUMENTS

| | | | |
|---|---|---|---|
| 3,868,274 | 2/1975 | Hubar et al. | 148/1.5 |
| 3,895,966 | 7/1975 | McDougall et al. | 148/1.5 |
| 4,052,229 | 10/1977 | Pashley | 148/1.5 |
| 4,074,301 | 2/1978 | Paivinen et al. | 357/23 |
| 4,089,712 | 5/1978 | Joy et al. | 148/175 |
| 4,128,439 | 12/1978 | Jambotkar | 148/1.5 |

OTHER PUBLICATIONS

Runge, "Threshold Voltage—Impln. of Donors", Appl. Phys. 8 (1975) 43.
Runge, "Threshold Voltage Shift—by Ion Implantation", Electronic Engineering, Jan. 1976, 41.
Fischer et al., "—Si—MOSFETS—Implanted Channel", Solid St. Electronics, 22 (1979) 225.
Abbas et al., "Short Channel—Transistor", IBM—TDB, 17 (1975) 3263.

Primary Examiner—L. Dewayne Rutledge
Assistant Examiner—Upendra Roy
Attorney, Agent, or Firm—H. Fredrick Hamann; Richard A. Bachand; Daniel R. McGlynn

[57] ABSTRACT

A microelectronic fabrication process for minimizing the threshold voltage variation across the surface of a wafer of semiconductor material. The process precisely specifies the degenerate (or heavily doped) impurity profile distribution by using ion implantation so as to minimize the autodoping of adjacent gate regions immediately after the ion implantation step during gate oxidation, while maximizing the surface concentration of the dopant at the ultimate silicon surface to achieve appropriate surface sheet resistance and junction depth after all circuit fabrication steps have been completed.

9 Claims, 20 Drawing Figures

MICROELECTRONIC FABRICATION METHOD MINIMIZING THRESHOLD VOLTAGE VARIATION

BACKGROUND OF THE INVENTION

The invention relates to microelectronic processing, and in particular to fabrication of large CCD arrays or MOS/LSI circuits in which variations in the absolute value of the MOS threshold voltage could exceed acceptable limits.

Various methods for controlling threshold voltage variation through processing techniques are known in the prior art. The threshold voltage is a function of several parameters, including the gate oxide thickness, the doping of the substrate, and the gate to silicon work function $\Phi_{GS}$. The threshold voltage can therefore be controlled by precisely controlling each of these variables. In practice, however, there are always non-uniformities in all of the variables.

One prior art technique adjusts for non-uniformities in certain ones of the parameters is varying the gate oxide thickness. This technique is frequently used in the prior art but does not result in the ultimate possible reduction in the threshold voltage variation in large wafers, since the range of $t_{ox}$ (the gate oxide thickness) is limited by device performance considerations and the physical limits on its dielectric integrity.

Another prior art technique is to use lightly doped initial substrate material and then ion implant the channel regions so as to create a more uniform doping at the surface. Yet another prior art technique is to use polysilicon gates with as low sheet resistivity as possible. The latter technique permits the $\Phi_{GS}$ term, the work function between the gate and the silicon substrate, to be more uniform.

All of these techniques used together limit the threshold voltage variation to reasonable levels for most applications. However, for demanding applications using large substrate areas such as large CCD arrays or MOS/LSI circuits with a large die area such techniques still do not permit the threshold voltage variation to be within acceptable limits. One of the side effects of the fabrication process which is not affected by such prior art techniques is the problem of autodoping of gate regions adjacent to degenerate diffusions, during gate oxide growth. Such autodoping results in appreciable local and wafer scale variations in the threshold voltage which are unacceptable for certain applications and which cannot be minimized using the prior art techniques.

SUMMARY OF THE INVENTION

Briefly, and in general terms, a method for minimizing the threshold voltage variation across the surface of a body of semiconductor material is disclosed. The method consists of making a semiconductor material structure by doping a pattern on the body with a dopant species such that the maximum concentration of the dopant species lies below the surface of the body and such that the surface concentration is approximately $10^{18}$ atoms/cm$^3$ or less.

Devices are subsequently formed at the active areas of the body so that the maximum concentration of dopant species ultimately lies at the newly defined surface of the semiconductor region.

More specifically, the present invention provides a method of making a semiconductor material structure having a substantially uniform doping concentration on the surface thereof and substantially uniform threshold voltage, including the steps of providing a body of semiconductor material of a predetermined conductivity type and resistivity; defining a pattern along a laterally extended major surface for active areas of said body doping the pattern with a dopant species for forming a region of semiconductor material of different resistivity so that the maximum concentration of the dopant species lies below the major surface of the body by a predetermined distance, and the concentration of the dopant species lies at the surface of the semiconductor region by the end of the fabrication process.

BRIEF DESCRIPTION OF THE DRAWINGS

FIG. 7b is a graph of the concentration of dopant atoms as a function of distance into the substrate along a line normal to the silicon surface through the n+ region in the cross-section shown in FIG. 7a;

DESCRIPTION OF THE PREFERRED EMBODIMENT

The present invention is concerned with minimizing the variation in the threshold voltage of a transistor element through an improvement in the fabrication process.

The threshold voltage $V_T$ of a MOS transistor element is basically determined by the impurity concentration, the dielectric constant of the semiconductor substrate, and the thickness and dielectric constant of the gate insulating layer. More specifically, for a p-channel MOS field effect transistor, the threshold voltage $V_T$ is given the following formula:

$$V_T = -\frac{Q_{SS} + \int_0^{t_{ox}} \rho_{ox} dx}{C_{ox}} - \frac{\sqrt{2K_{Si}\epsilon_o q N_D |2\Phi_F|}}{C_{ox}} - 2\Phi_F - \Phi_{GS}$$

where $Q_{SS}$ is the surface charge at the $SiO_2$ surface (units: coulomb/cm$^2$);

$t_{ox}$ is the gate oxide thickness (cm);

$\rho_{ox}$ is charge distribution in the silicon oxide (coulombs/cm$^3$);

$C_{ox}$ is gate oxide capacitance per unit area (farad/cm$^2$)

$K_{Si}$ is dielectric constant of silicon;

$\epsilon_o$ is dielectric permittivity of free space;

q is electronic charge;

$N_D$ is concentration of dopant atoms in the n-type region (atoms/cm$^3$);

$\Phi_F$ is Fermi potential of silicon at a given temperature (with respect to $\Phi_i$, the intrinsic Fermi potential);

$\Phi_{GS}$ is gate to silicon work function. (>0)

The first term in the above definition for the threshold voltage is minimized by clean processing techniques which avoid contamination of the oxide, and although there may be slight gradual variations in $C_{ox}$ over the wafer of 1-5%, such variations are assumed to be scaled smaller over the area of a single die.

The second, third and fourth terms in the threshold voltage definition above are affected by variations in the substrate dopant concentration $N_D$. The strongest dependence upon $N_D$ is in the second term, in which the threshold voltage varies as a function of the square root of $N_D$. The fourth term $\Phi_{GS}$ is affected by variations in the polysilicon gate dopant concentration, as well as by $N_D$. However it must be pointed out that the polysilicon is normally deposited with as low as a sheet resistance ($R_S$) as possible, and the variations in $R_S$ over a single die are minimized. Therefore, variations in $\Phi_{GS}$ due to variations in the polysilicon $R_S$ are negligible compared with the square root of $N_D$ term since $\Phi_{GS}$ varies quite slowly with $R_S$.

To indicate how the threshold voltage might vary, assume that as an example, $C_{ox}$ and the polysilicon $R_S$ are constant, and the gate oxide thickness ($t_{ox}$) is 1500 Angstroms. Consider a 5% variation in $N_D$, which is normally equal to $10^{15}$ atoms/cm$^3$. This would result in a 31.5 millivolt change in $V_T$. Presently the most uniform wafers commercially available have from 10–20% uniformity in $N_D$ across the wafer radius. (Neutron transmutation doped silicon wafers claim a 5% uniformity in $N_D$ but the minority carrier lifetime in such wafers is too short for high performance MOS devices).

We first consider the fabrication method for producing a MOS/LSI or CCD circuit, and in particular a double polysilicon layer circuit using the well known isoplanar processes using a silicon wafer. Although such processes are described here as an embodiment of the present invention, the invention is not limited to such processes, and could be used with different semiconductor processes, such as the bipolar process, or with different semiconductor materials as well.

Figure 1:
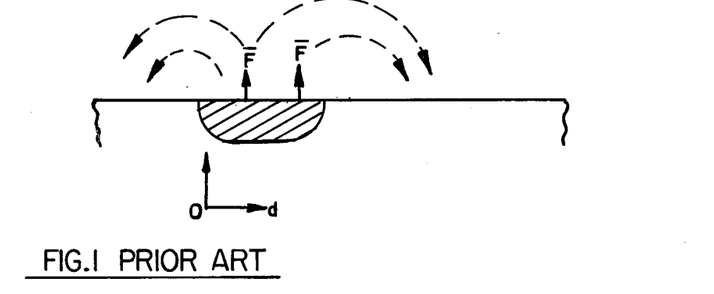
FIG. 1 is a diagramatic view of the process of autodoping in a silicon wafer such as found in the prior art processes.

Several observations must first be made concerning the process step of deposition of dopant ions by prior art techniques of gaseous furnace deposition or shallow ion implantation. The impurity distribution in either case results in a very large surface concentration, $C_S$, which decays Gaussian with depth into the wafer. After such deposition, and during the first few moments of the gate oxidation, dopant ions from the doped n+ and p+ regions will outgas from such regions according to the flux equation:

$$F = (h\Delta C)\hat{n}$$

where F is the dopant flux, $\hat{n}$ is the unit normal to the silicon surface, h is the surface transport coefficient and $\Delta C$ is the concentration difference (or flux potential) between the silicon and the ambient. In the case of the prior art $\Delta C = C_S$, the concentration of the dopant at the surface. After the dopant atoms leave the n+ (or p+) surface, they will enter the ambient atmosphere where they have a relatively long mean free path and settle on nearby regions of lighter doped silicon, that is the nearest gate regions. This process, illustrated in FIG. 1, is known as "autodoping". The amount of autodoping will decrease with the distance from the source of the flux, as well as be affected by a number of external factors such as the carrier gas flow velocity in the furnace tube and temperature. After a few hundred Angstroms of the oxide is grown, the source of doped regions therefore becomes sealed, and the gate areas are masked and the autodoping process ceases. However, the autodoping which has already occurred results in unacceptable variations in the threshold voltage.

Figure 2:
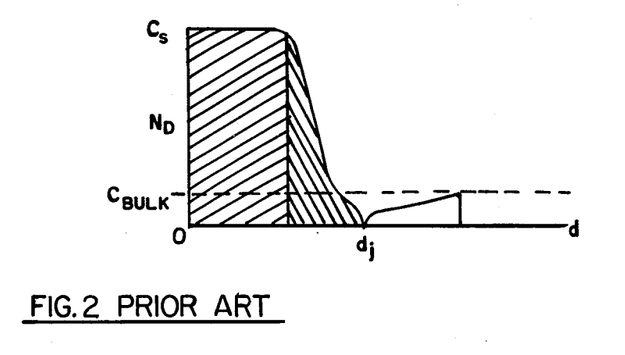
FIG. 2 is a graph of the concentration of dopant atoms in a silicon wafer in prior art processes as a function of the distance along the silicon surface.

FIG. 2 is a graph of the resultant concentration of dopant atoms at the surface of the silicon substrate. Region 1 is a p+ defined region, region 2 is the laterally diffused p+ region, and region 3 is the adjacent gate region which has been counter doped by p+ autodoping.

It is noted that the degenerate doping profile is basically a Gaussian with a peak at the surface of the silicon. The peak value is $C_S$. Typical values of $C_S$ for a p-channel surface mode CCD would be $5 \times 10^{20}/cm^3$ for p+, and $1 \times 10^{20}/cm^3$ for n+. The value of $C_S$ for furnace depositions on large wafers is relatively non-uniform, and can vary as much as 20% over the surface of a 3" diameter wafer.

The present invention eliminates such localized variations in $N_D$ due to autodoping by the reduction in $\Delta C$ at the time of the first gate oxidation. Such reduction must however be achieved so that the p+ and n+ diffusions which form the active regions of the circuit have the correct $R_S$ or $C_S$ at the end of the fabrication sequence for proper operation of the device. This is done in the present invention by using ion implantation for the n+ and p+ deposition subject to the following criteria:

a. specifying that the initial peak of the ion implant profile is considerably below the surface, i.e. at least 2.2 standard deviations of the projected range of the implant profile, so that $C_S$ is better than $1/e^5$ less than the peak value of the impurity distribution profile;

b. specifying the range (i.e. the distance of the implant peak from the surface) and dose of the n+ and p+ ion implants such that after all the post-implant oxidation and other high temperature steps and etches in the fabrication process have taken place, the correct sheet resistances and junction depths have been obtained as required by the specification of the device; and c. minimizing the high temperature processing after the n+ and p+ implants prior to the first gate oxidation so that the peaks remain below the surface and $C_S$ remains small;

The present invention implements these criteria by specifying the energy at which the ion implantation of the dopant species is to take place. The value of the energy depends upon the specific dopant and operational requirements, and may be calculated from known formulas once the desired range is specified. As one example, the prior art may specify an ion implantation energy for boron at 50 keV, while the present invention specifies an ion implantation energy of 120 keV in the same application.

Following the above protocol according to the present invention, reductions in $C_S$ of $10^2$ or $10^3$ can be accomplished. As a result the local variations in $N_D$ may be kept to below 1%. In such a situation the local variation of the threshold voltage can be kept below 7 millivolts for $\overline{N}_D = 10^{15}$ and $t_{ox} = 1500$ Å, which is suitable for the intended applications of large CCD arrays or MOS/LSI circuits.

Figure 3A:
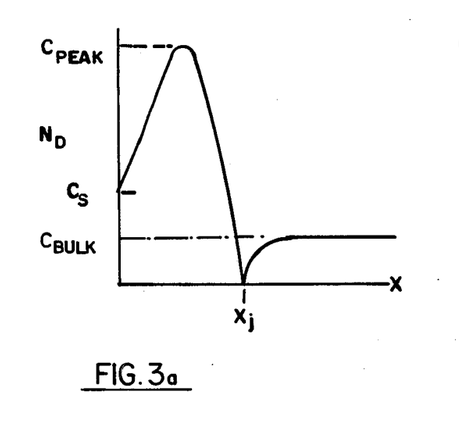
FIG. 3a is a graph of the concentration of boron atoms in the silicon wafer as a function of distance into the substrate along a line normal to the surface before the oxidation and diffusion steps according to the present invention.

FIG. 3a is a graph of the concentration of boron atoms in the silicon wafer as a function of distance into the substrate along a line normal to the surface before the oxidation and diffusion steps according to the present invention. The peak of the concentration is seen to be considerably below the surface, as required by the first criteria noted above.

Figure 3B:
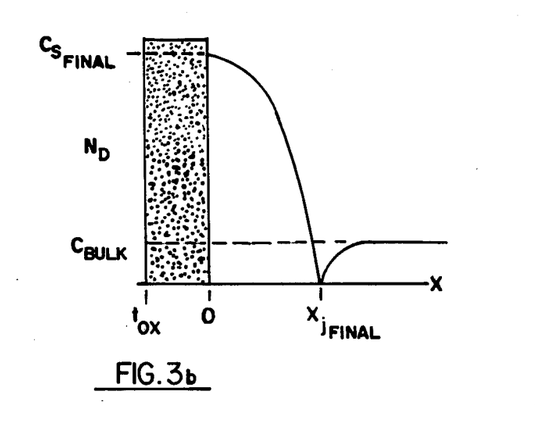
FIG. 3b is a graph of the final concentration of boron atoms in the silicon wafer after the sequence of process steps have taken place, indicating that the process steps have resulted in the growth of an oxide region on the surface of the silicon substrate such that the maximum value of the boron concentration now lies at the silicon surface.

FIG. 3b is a graph of the final concentration of boron atoms in the silicon wafer after the sequence of process steps have taken place, indicating that the process steps have resulted in the growth of an oxide region on the surface of the silicon substrate such that the maximum value of the boron concentration now lies at the silicon surface.

Turning next to FIGS. 4-11, we explicitly describe a typical fabrication process of a double polysilicon gate MOS/LSI or CCD circuit using the isoplanar process incorporating the technique according to the present invention.

The starting material is a [100] silicon wafer substrate whose initial dopant concentration is relatively low, that is, a wafer having a relatively high resistivity. To take the example of fabricating a p-channel MOS transistor, the starting material is an n-type silicon wafer having a resistivity of the order of 3-5 ohm-centimeters. In the accompanying figures this is generally designated as n material, but such a designation is only intended to specify the dopant concentration in comparison with the dopant concentration of other n-type materials in the circuit. The designations n or n+ are not designations of absolute dopant level but merely relative dopant level.

Figure 4:
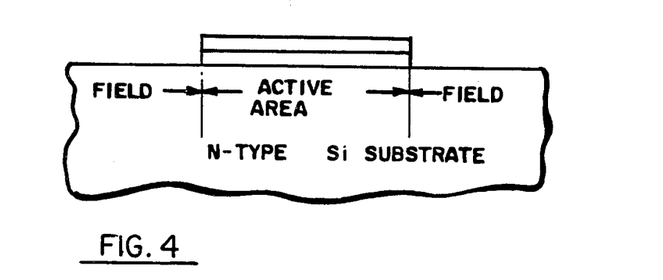
FIG. 4 is a cross-sectional view of the surface of the silicon during the first of the process steps known as field masking.
Figure 5:
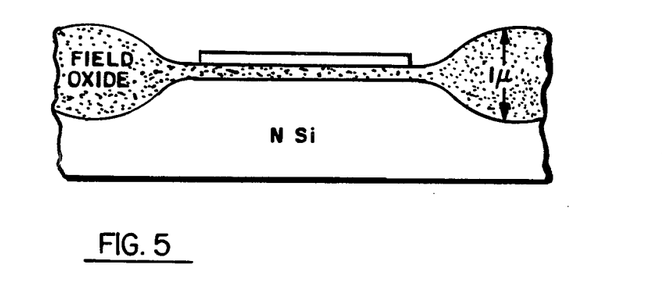
FIG. 5 is a cross-sectional view of the surface of the silicon during the second in the process steps known as field oxidation.

The preferred processing sequence begins by first growing on the silicon wafer with a thin silicon dioxide film about 600 Angstroms in thickness by exposing the wafer to steam for 30 minutes at a temperature of 875° C. A silicon nitride film about 600 Angstroms in thickness is then deposited over the oxide placing the slice in a reactor containing silane and ammonia gas. A photoresist is then applied to the wafer in a pattern to define the active circuit components, and the nitride is removed by a RF plasma etching process which does not attack the oxide layer. This step is known as field masking, and is illustrated in FIG. 4, which is a cross-sectional view of the silicon wafer. In the exposed areas a field oxide is grown by placing the wafer in a furnace at about 1000° C. in steam atmosphere for several hours until the oxide grows to a thickness of about 1 micron. As the silicon oxide grows, it extends into the face or surface of the exposed silicon layer to a depth of about 5,000 Å in the exposed areas, as shown in FIG. 5. In the areas where the nitride was not removed, the nitride film masks the growth of oxide beneath it, and both the nitride and thin oxide film remain at a thickness of 600 Å each.

The next step is to remove both the nitride and oxide films by etching, thereby exposing a layer of silicon with regions or patches of field oxide surrounding them.

Figure 6A:
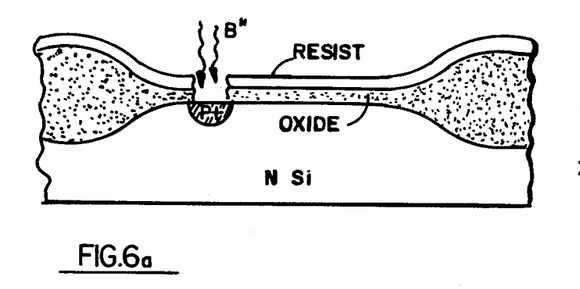
FIG. 6a is a cross-sectional view of the surface of the silicon during the third in the sequence of process steps known as p+ mask and implant.

FIG. 6a shows the p+ mask and implantation step in which about 3,000 Angstroms of oxide are grown in the active area of the chip. This step is similar to the field oxidation step in which the wafer is placed in a furnace at 1,000° C. in steam for about one hour. After the oxidation, photoresist is applied to form the window pattern for where the p+ diffusion in the active area of the chip is desired. Windows in the oxide are etched with hydrofluoric acid to form the oxide pattern. The resist, which is about a micron thick, and the oxide pattern together form a mask for ion implantation.

A dopant species, such as boron, is then ion implanted into the silicon according to the present invention so that the peak of the concentration distribution of the boron is about 4,000 Angstroms below the surface of the wafer. The particular depth is chosen to meet the ultimate dopant species surface concentration, sheet resistance, and other properties required at the end of the fabrication process. In the present example, the p+ peak concentration is about $1.7 \times 10^{20}$ atoms/cm$^3$, although the maximum could be about $5 \times 10^{20}$ atoms/cm$^3$.

Figure 6B:
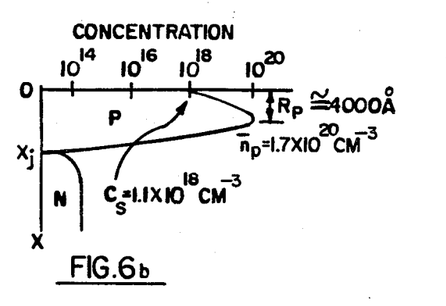
FIG. 6b is a graph of the concentration as a function of distance into the substrate along a line normal to the silicon surface through the p+ region of the cross-section shown in FIG. 6b.

FIG. 6b shows a graph of the concentration as a function of distance into the substrate along a line normal to the silicon surface through the p+ region, according to the present invention. After the ion implant step has been completed, the resist is stripped and about 2,000 Angstroms of silox is deposited and densified in a nitrogen or oxygen atmosphere for about 10 minutes at 1,000° C.

Figure 7A:
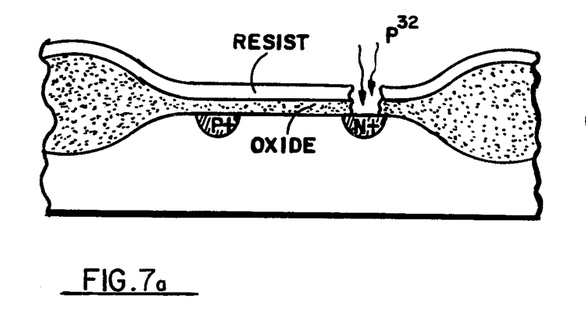
FIG. 7a is a cross-sectional view of the silicon wafer during the next in the process steps known as n+ mask and implant.

FIG. 7a is a cross-sectional view of the silicon wafer during the next in the process steps known as n+ mask and implant. Again using photoresist technology windows are formed where n+ regions are wanted in the active area of the chip. Windows are formed in the resist, holes are etched in the oxide, around 4,000 Angstroms thick in these regions. With the resist and the oxide as a mask, the n+ pattern is ion implanted with a dopant species such as phosphorous. In this particular circuit, the peak of the concentration distribution of the phosphorous dopant is about 2500 Angstroms below the surface, and the peak concentration is around $5 \times 10^{19}$ atoms/cm$^3$. Such values are chosen in order to meet the ultimate dopant species surface concentration, sheet resistance, contact and channel stop parameters required for this particular circuit, although the peak concentration may go as high as $1 \times 10^{20}$ atoms/cm$^3$ in other applications. After the ion implant is actually done, one then strips the resist and goes on to the next step.

Figure 7B:
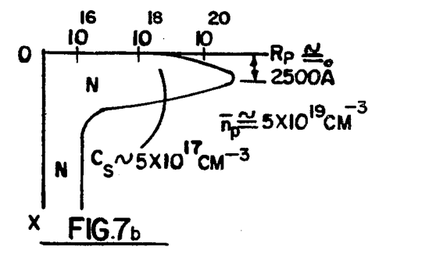

FIG. 7b is a graph of the concentration of dopant atoms as a function of distance into the substrate along a line normal to the silicon surface through the n+ region in the cross-section shown in FIG. 7a.

Figure 8A:
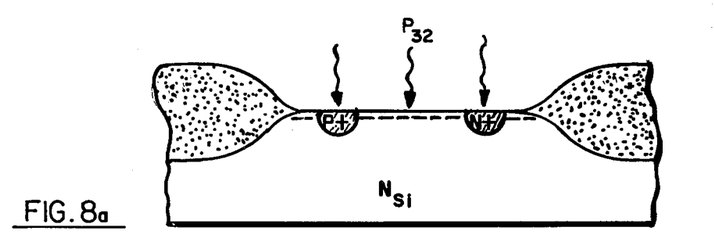
FIG. 8a is a cross-sectional view of the surface of the silicon during the gate implant step.

The next step shown in FIG. 8a, a cross-sectional view of the surface of the silicon during gate impant, is probably the most critical in the process. At this time all the oxide in the active circuit area of the chip is stripped so there is bare silicon in the active region and around one micron of field oxide. At this time the p+ and n+ regions are therefore also bare. If a furnace was used for deposition of the n+ and p+ regions, instead of ion implantation, the surface concentration would be above $10^{20}$ atoms/cm$^3$ in the p+ and n+ regions. With such heavy surface concentration, once the wafer was heated up there would be significant outgasing from the n+ or p+ regions because of the high concentration there. However, in the method according to the present invention, which uses ion implantation instead, the peak is below the surface and the surface concentration is below $10^{18}$ atoms/cm$^3$. The potential for outgasing has been reduced by a factor of $10^2$. With this in mind, one can then do a shallow ion implant for threshold adjustment in the gate regions of the device, and then perform the gate oxidation.

Figure 8B:
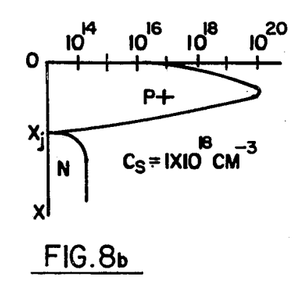
FIG. 8b is a graph of the concentration of dopant atoms as a function of distance into the substrate along a line normal to the silicon surface through the p+ region in the cross-section shown in FIG. 8c.

FIG. 8b is a graph of the concentration of dopant atoms as a function of distance into the substrate along a line normal to the silicon surface through the p+ region in the cross-section shown in FIG. 8c.

Figure 8C:
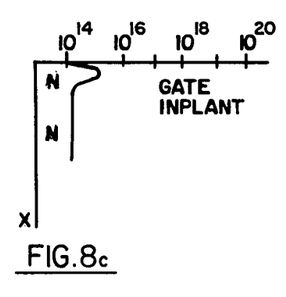
FIG. 8c is a graph of the concentration of dopant atoms as a function of distance into the substrate along a line normal to the silicon surface through the channel region between the p+ and n+ implants in the cross-section shown in FIG. 8c.

FIG. 8c is a graph of the concentration of dopant atoms as a function of distance into the substrate along a line normal to the silicon surface through the channel region between the p+ and n+ implants in the cross-section shown in FIG. 8c.

Figure 8D:
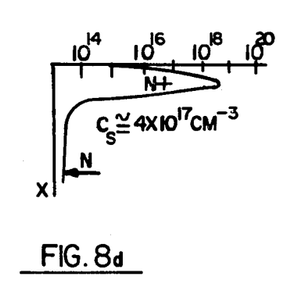
FIG. 8d is a graph of the concentration of dopant atoms as a function of distance into the substrate along a line normal to the silicon surface through the n+ region in the cross-section shown in FIG. 8c.

FIG. 8d is a graph of the concentration of dopant atoms as a function of distance into the substrate along a line normal to the silicon surface through the n+ region in the cross-section shown in FIG. 8c.

Figure 9:
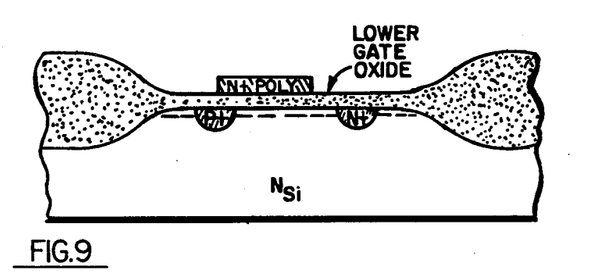
FIG. 9 is a cross-sectional view of the surface of the silicon during the first poly gate fabrication step.

The next step shown in FIG. 9 is the fabrication of the first polysilicon gates which are composed of about 0.5 $\mu$ of n+ polysilicon having a sheet resistance of about 25 ohms per square. The gates are defined with photoresist technology, and plasma etching or chemical etching is used to etch the polysilicon. Subsequently the photoresist is stripped. If one needs a polysilicon to polysilicon contact, the first polysilicon layer is oxidized and windows etched in that oxide to make contacts to the poly for the next step.

Figure 10:
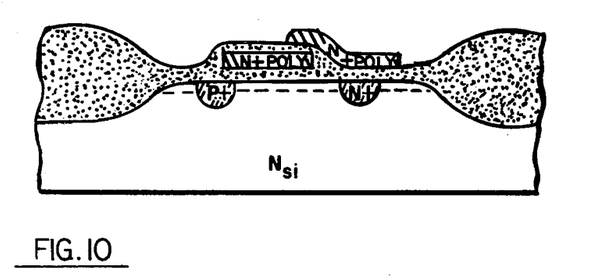
FIG. 10 is a cross-sectional view of the surface of the silicon during the second poly gate fabrication step.

The next step shown in FIG. 10 is the upper level gate fabrication. After the wafer has been oxidized and the first polysilicon pattern defined, another n+ polysilicon layer half a micron thick 25 ohms per square is deposited on the wafer. Photoresist technology is again used to define the second layer of polysilicon. The polysilicon is etched and the photoresist stripped as in the previous step.

Figure 11A:
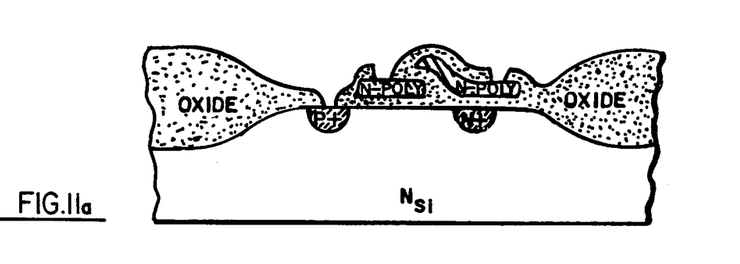
FIG. 11a is a cross-sectional view of the surface of the silicon during the metal contact window mask fabrication step.
Figure 11B:
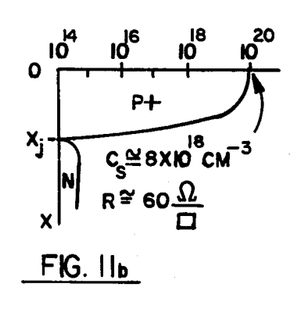
FIG. 11b is a graph of the concentration of dopant atoms as a function of distance into the substrate along a line normal to the silicon surface through the p+ region in the cross-section shown in FIG. 11c.
Figure 11C:
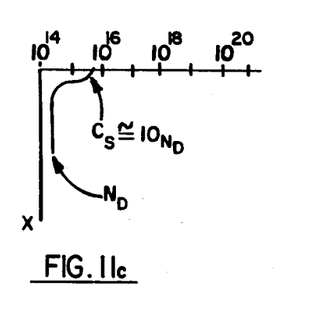
FIG. 11c is a graph of the concentration of dopant atoms as a function of distance into the substrate along a line normal to the silicon surface through the channel region between the p+ and n+ implants in the cross-section shown in FIG. 11c.

Following this the wafers are oxidized to about 3000 Angstroms over the upper polysilicon. There is also an oxide thickness of about 4,000 Angstroms over the p+ silicon and about 4,000 Angstroms over the n+ silicon. Thickness of oxide between the polysilicon layers is about 3,000 Angstroms for this particular process. Photoresist technology is again used to etch windows in the oxides to make contact to the appropriate upper and lower polysilicon gates and the appropriate n+ and p+ diffusions as shown in FIG. 11. At this point in time all the high temperature processing on the wafer is done. There must be a certain surface concentration for p+, a certain junction depth, and a certain sheet resistance. In the particular example considered here, the requirements are a 60 ohms per square sheet resistance for p+, $8 \times 10^{18}$ atoms/cm$^3$ surface concentration, and junction depth about 1.5 microns.

Figure 11D:
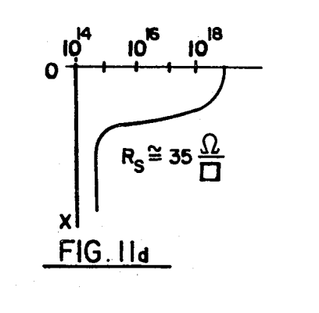
FIG. 11d is a graph of the concentration of dopant atoms as a function of distance into the substrate along a line normal to the silicon surface through the n+ region in the cross-section shown in FIG. 11c.

In the n+ region there is a channel stop slightly over 1.0 micron deep and having a surface concentration of 6 or $7 \times 10^{18}$ atoms/cm$^3$, and a sheet resistance of around 80 to 90 ohms–square. The aluminum interconnect pattern is then formed using state of the art vacuum and photoresist technology.

In order to quantitatively demonstrate the improvement in threshold voltage variation using the process according to the present invention, we consider an example.

We first assume that variations in $N_D$, $t_{ox}$, $N_G$ are gradual across the wafer, and if such variables have periodicity the period is on the order of the wafer diameter.

We next assume that we use the best substrate material presently commercially available (with respect to dopant concentration uniformity), and that the wafer has had a "channel" implant to further enhance the dopant concentration uniformity. The dopant concentration (in atoms) is:

$$N_D = 1 \times 10^{15} \text{cm}^{-3} \pm 2.5\% \text{ radially across 3" diameter wafer}$$
$$\pm 0.5\% \text{ across a 250 mil chip}$$
$$\pm 0.1\% \text{ across a large } (\geq 10\mu) \text{ gate,}$$
$$\text{e.g. CCD}$$

The gate oxide thickness is $$t_{ox} = 1500 \text{ Å} \pm 5\% \text{ wafer}$$
$$\pm 1\% \text{ chip}$$
$$\approx \pm .1\% \text{ gate}$$

The polysilicon gate (N+) dopant concentration is $$N_G = 1 \times 10^{20} \text{cm}^{-3} (\sim 100 \, \Omega/\square) \mp 15\% \text{ wafer}$$
$$\mp 3\% \text{ chip}$$

∓ .3% gate

If, according to the prior art, the N+ and P+ diffusions were done with a furnace tube deposition and the surface concentration, $C_s$ ($> 10^{19}$ cm$^{-3}$), of these diffusions would vary according to $$\Delta\, C_S(N^+, P^+) = \pm\, 20\% \text{ wafer (typ. 40-60 } \Omega/\square)$$
$$\pm\, 4\% \text{ chip}$$
$$\text{(gate \% not relevant here)}$$

For a given $C_S$ of $N^{30}$ (P+) a MOS gate adjacent to this diffusion could suffer a variation in $N_D$ due to autodoping that would occur during the first few moments of the MOS gate oxidation. This is a local effect (to an individual gate) and would be uniform across a wafer or chip if the $\Delta C_S$ of N+ (P+) were zero. For example, a CCD transfer gate could have a nonuniform depletion layer width as a result of this effect or the MOSFET threshold voltage would be shifted. This local effect could have a further asymmetrically based variation across the chip due to variations in the chip's circuit layout, e.g. more n+ or p+ adjacent to gates in certain regions of the circuit such as the case where one region has n+ channel stops (p channel) while another does not, etc. However, this additional effect cannot be predicted in general terms.

For example, the local effect could have a range of 1%, 5%, 10%, 30% variation in $N_D$ from the autodoping depending on the magnitude of $C_S$ ($10^{19}$-$10^{21}$ cm$^{-3}$) used in the particular process. Based on the $\pm 20\%$ $\Delta C_S$ of the wafer and $\pm 4\%$ $\Delta C_S$ across a chip, these percent $\Delta N_D$ in the local effect would represent the following $\Delta N_D$'s due to the autodoping alone.

| Gate (%) | Chip (%) | Wafer (%) |
|---|---|---|
| 1 | .04 | .2 |
| 5 | .2 | 1 |
| 10 | .4 | 2 |
| 30 | 1.6 | 6 |

Since the autodoping variations and the native wafer variations in $N_D$ are statistically independent, their total is found through quadratures.

Taking the total $\Delta N_D$, the $\Delta t_{ox}$, and the $\Delta N_G$, for this range of $\Delta N_D$ (gate), we have the following range of variation in threshold voltage ($N_{SS} = 5 \times 10^{10}$ cm$^{-2}$) according to the prior art:

| $\Delta_D$ (Gate Only Autodoping) | (1) $\Delta V_{TH}(G)$ | (1) $\Delta V_{TH}(\text{Chip})$ | (1) $\Delta V_{TH}(\text{Wafer})$ |
|---|---|---|---|
| 0% | 1.51 mV | 12.95 mV | 64.87 mV |
| 1 | 5.34 | 12.96 | 64.88 |
| 5 | 22.15 | 13.12 | 65.67 |
| 10 | 42.73 | 13.55 | 67.91 |
| 30 | 120.76 | 16.38 | 82.30 |

Values of percent local autodoping of 20-30% are quite probable for the heavy p+ and n+ diffusions used, especially for large chips where one needs low sheet resistance.

Now, let us calculate the threshold voltage variation using the process according to the present invention. The $\Delta N_D$ (gate autodoping) is reduced drastically, as well as the $\Delta C_S$ of N+(P+). This would give:

$$\Delta\, C_{Snew}: \pm\, 3\% \text{ wafer formerly } 20\%$$
$$\pm\, .6\% \text{ chip formerly } 4\%$$

So, combining these we have the $\Delta N_D$ due to the reduced autodoping: $\pm 0.015\%$ wafer, $\pm 0.003\%$ chip, $\pm 0.5\%$ gate. Adding these variations in quadratures to the $\pm 2.5\%$, $\pm 0.5\%$, $\pm 0.1\%$ variation of the wafer across the wafer, chip and gate we get:

$$\Delta\, N_D \text{ total}: \pm\, 2.5\% \text{ wafer}$$
$$\pm\, 0.50\% \text{ chip}$$
$$\pm\, 0.503\% \text{ gate}$$

For the same variations in $t_{ox}$ and $N_G$ as assumed in the prior art this gives for the threshold voltage variation $$\Delta\, V_{TH}^{(2)} = \pm\, 64.83 \text{ mV wafer}$$
$$\pm\, 12.95 \text{ mV chip}$$
$$\pm\, 3.22 \text{ mV gate}$$

As a comparison, these values represent the following % improvements in $\Delta V_{TH}$ over a wafer, chip, and gate, for the various percent autodoping that one had in the prior art.

| Wafer | Chip | Gate | $\Delta N_D$ Autodoping |
|---|---|---|---|
| .08% | .08% | 39.7% | 1% |
| 1.3 | 1.3 | 85.8 | 5 |
| 4.5 | 4.5 | 92.5 | 10 |
| 21.3 | 21.3 | 97.1 | 30 | where the % improvement =

$$\frac{\Delta V^{(1)} - \Delta V^{(2)}}{\Delta V^{(1)}} \times 100$$

It should also be noted that if after the previous result, $t_{ox}$ were reduced to 1,000 Angstroms we would have a 35.2% W, 35.0% C, 32.6% G improvement in a $\Delta V_{TH}$. If $N_{SS}$ were reduced to $2 \times 10^9$ cm$^{-2}$, we would have a further 20.2% W, 20.2% C, 7.9% G improvement in $\Delta V_{TH}$.

The above table which indicates an improvement in threshold voltage variation up to 20% over a wafer, and up to 97% over a gate area, demonstrates the considerable improvement over the prior art provided by the present invention.

Having thus set forth a preferred embodiment of the invention, what is claimed is:

1. A method of making a semiconductor circuit having a substantially uniform doping concentration on the surface thereof and a substantially uniform threshold voltage from a body of semiconductor material of a predetermined conductivity type and resistivity, comprising the steps of:
   defining a pattern on a laterally extending major surface of said body where devices are to be formed;
   ion implanting locations defined by said pattern on said body a single time with dopant species for forming regions with a predetermined concentration profile of semiconductor material of different resistivity in said body, the maximum concentration of the dopant species lying below said major surface of said body by a predetermined distance and the concentration of the dopant species at the body surface is less than or equal to $10^{18}$ atoms/cm$^3$, and subsequently forming devices having substantially the same threshold voltage at said regions during which step said major surface of said body moves with respect to the location of the maximum concentration of the dopant species so that the maximum concentration of the dopant species lies at said major surface of said body at the completion of the step of forming devices.

2. A method as defined in claim 1, wherein said ion implanting step is performed at an energy between 100 keV and 200 KeV.

3. A method as defined in claim 1, wherein said body is comprised of n-type semiconductor material and said ion implanting step deposits dopant ions such that said regions at semiconductor material are of p+ type, and the maximum concentration of the dopant ions lies below the surface by a distance approximately equal to 4,000 Angstroms.

4. A method as defined in claim 1, wherein said body is composed of n-type semiconductor material and said ion implanting step deposits dopant ions such that said regions of semiconductor material are of n+ type, and the maximum concentration of dopant ions lies below the surface by a distance approximately equal to 2,500 Angstroms.

5. A method as defined in claim 1, wherein said step of forming devices comprises forming insulated gate field effect transistor devices.

6. A method as defined in claim 1, wherein said semiconductor material is silicon, and said step of forming devices comprises the steps of growing a first oxide layer over at least a portion of the semiconductor body; and depositing a first polysilicon layer over said first oxide layer.

7. A method as defined in claim 3, wherein said dopant ions comprises boron and said maximum concentration is at most $5 \times 10^{20}$ atoms/cm$^3$.

8. A method as defined in claim 4, wherein said dopant ions comprises phosphorous as said maximum concentration is at most $1 \times 10^{20}$ atoms/cm$^3$.

9. A method as defined in claim 6, further comprising the steps of;

growing a second oxide layer over said first polysilicon layer; and depositing a second polysilicon layer over said second oxide layer.

* * * * *

UNITED STATES PATENT AND TRADEMARK OFFICE
CERTIFICATE OF CORRECTION

PATENT NO. : 4,218,267
DATED : August 19, 1980
INVENTOR(S) : R. L. Maddox, III

It is certified that error appears in the above-identified patent and that said Letters Patent are hereby corrected as shown below:

Col. 4, Line 4 delete [as] (second occurence).
Col. 9, line 13 delete [$N^{30}$] and insert ---$N^+$---.

Signed and Sealed this

Twenty-eighth Day of October 1980

[SEAL]

Attest:

SIDNEY A. DIAMOND

Attesting Officer

Commissioner of Patents and Trademarks

UNITED STATES PATENT AND TRADEMARK OFFICE
CERTIFICATE OF CORRECTION

PATENT NO. : 4,218,267
DATED : August 19, 1980
INVENTOR(S) : Roy L. Maddox, Jr.

It is certified that error appears in the above-identified patent and that said Letters Patent are hereby corrected as shown below:

On the title page, at line [19] following United States Patent, change [Maddox, Jr.] to read --Maddox, III--.

In line [75] on title page, change [Inventor: Roy L. Maddox, Jr.,] to read --Roy L. Maddox, III--.

Signed and Sealed this

Twenty-seventh Day of October 1981

[SEAL]

Attest:

*Attesting Officer*

GERALD J. MOSSINGHOFF

*Commissioner of Patents and Trademarks*